(12) United States Patent  
Figura (10) Patent No.: US 6,225,208 B1  
(45) Date of Patent: May 1, 2001

(54) METHOD AND STRUCTURE FOR IMPROVED ALIGNMENT TOLERANCE IN MULTIPLE, SINGULARIZED PLUGS

(75) Inventor: Thomas A. Figura, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/576,503

(22) Filed: May 23, 2000

Related U.S. Application Data (63) Continuation of application No. 09/140,810, filed on Aug. 25, 1998, now Pat. No. 6,066,552.

(51) Int. Cl.[7] .............................................. H01L 21/4763
(52) U.S. Cl. ...................... 438/622; 438/623; 438/637; 438/675
(58) Field of Search .................................. 438/622, 623, 438/624, 637, 675; 257/306, 311

(56) References Cited

U.S. PATENT DOCUMENTS

| 5,244,534 | 9/1993 | Yu et al. ................................ 156/636 |
| 5,338,700 | 8/1994 | Dennison et al. ...................... 437/60 |
| 5,387,550 | 2/1995 | Cheffings et al. ................... 437/189 |
| 5,451,546 | 9/1995 | Grubisich et al. .................... 437/200 |
| 5,488,011 | 1/1996 | Figura et al. ........................... 437/60 |
| 5,569,948 | 10/1996 | Kim ...................................... 257/382 |
| 5,580,821 | 12/1996 | Mathews et al. ..................... 437/187 |
| 5,658,829 | 8/1997 | Mathews et al. ..................... 438/656 |
| 5,710,073 | 1/1998 | Jeng et al. ............................ 438/239 |
| 5,776,815 | 7/1998 | Pan et al. ............................. 438/396 |
| 5,780,339 | 7/1998 | Liu et al. ............................. 438/253 |
| 5,792,687 | 8/1998 | Jeng et al. ............................ 438/253 |
| 5,817,573 | 10/1998 | Rhodes et al. ....................... 438/626 |
| 5,825,059 | 10/1998 | Kuroda ................................ 257/301 |
| 5,858,865 | 1/1999 | Juengling et al. ................... 438/585 |
| 5,872,048 | 2/1999 | Reinberg ............................. 438/584 |
| 5,956,594 | * 9/1999 | Yang et al. .......................... 438/396 |
| 6,066,552 | * 5/2000 | Figura ................................. 438/622 |
| 6,117,725 | * 9/2000 | Huang ................................. 438/241 |
| 6,127,260 | * 10/2000 | Huang ................................. 438/629 |

FOREIGN PATENT DOCUMENTS 4445796   12/1993   (DE) .......................... H01L/27/105

* cited by examiner

*Primary Examiner*—Son T. Dinh
(74) *Attorney, Agent, or Firm*—Schwegan, Lundberg, Woessner & Kluth, P.A.

(57) ABSTRACT

An improved method and structure which increases the alignment tolerances in multiple, singularized plugs are provided. The invention discloses a novel method for forming individual plug contacts with increased surface area for improved registration between semiconducting layers. Also the improved plug contacts are particularly well suited to receiving contact formations which have any taper to them. IGFETS and other devices formed from this design can be used in a variety of beneficial applications, e.g. logic or memory.

18 Claims, 4 Drawing Sheets

METHOD AND STRUCTURE FOR IMPROVED ALIGNMENT TOLERANCE IN MULTIPLE, SINGULARIZED PLUGS

This application is a Continuation of U.S. application Ser. No. 09/140,810, filed Aug. 25, 1998 now U.S. Pat. No. 6,066,552.

FIELD OF THE INVENTION

The present invention relates generally to semiconductor integrated circuits. More particularly, it pertains to a method and structure for improved alignment tolerance in multiple, singularized plugs.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Interconnecting and completing the millions of microscopic components typically entails forming contact plugs, covering the plugs and components with an insulative layer of silicon dioxide, and then etching narrow, but often deep, holes in the insulative layer to expose portions of the components, or contact plugs underneath. These holes are then filled with another conductive material, or are developed into additional component parts, e.g., storage nodes for memory cells.

An insulated-gate field-effect transistor (IGFET), such as a metal-oxide semiconductor field-effect transistor (MOSFET), is one example of an electrical component requiring contact plugs and etched holes for connection to other portions of an integrated circuit. IGFET's are frequently used in both logic and memory chip applications. An IGFET uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a gate oxide. The operation of the IGFET involves application of an input voltage to the gate, which sets up a transverse electric field in the channel in order to modulate the longitudinal conductance of the channel. Plug contacts and contact openings are required in IGFETs to complete the conductance circuit between the source and drain regions.

Current industry demands are pushing toward increased capacity on individual semiconductor chips in order to yield greater functionality. The push for increased circuit density has been realized through an increase in the miniaturization of individual components, the number of surface layers, and in the depth of contact openings between individual surface layers. Unfortunately, while design rules have shrunk, the registration of layers, or alignment of contacts from one surface layer to the next, has not improved at the same aggressive rate. The problem is compounded by the fact that the very deep contact openings include some taper to them which reduces the alignment tolerance even more dramatically.

Thus a continual need exists for creating improved contact structures, including the formation of contact plugs and contact openings, to improve the registration between semiconductor layers.

SUMMARY OF THE INVENTION

The above mentioned problems with registration tolerances between layers and other problems are addressed by the present invention and will be understood by reading and studying the following specification. A method and structure are provided which accord improved results.

In particular, an illustrative embodiment of the present invention includes an integrated circuit device on a substrate. The device includes a number of semiconductor surface structures which are spaced apart along the substrate. A number of plugs contact to the substrate between the number of surface structures. The number of plugs includes an inner plug and a pair of outer plugs. Each one of the outer pair is formed adjacent to and on opposing sides of the inner plug. Each one of the outer pair has an upper portion which covers areas of the surface structures. An inner electrical contact couples to the inner plug and is separated from the upper portions of the outer plugs by spacers.

In another embodiment, a memory device is provided. The memory device includes multiple insulated wordlines with top surfaces. The insulated wordlines are spaced apart from one another and formed on a substrate. A bitline plug is located between an adjacent pair of the insulated wordlines. The bitline plug has a top surface beneath the top surfaces of the adjacent pair. A pair of storage node plugs are located on the opposite side of the adjacent pair of insulated wordlines from the bitline plug. The pair of storage node plugs each have a top surface above the top surfaces of the insulated wordlines and are formed over portions of the adjacent wordlines. A buried bitline couples to the bitline plug. And, a pair of opposing spacers are located above the adjacent pair of insulated wordlines such that the spacers isolate the buried bitline from the pair of storage node plugs.

In another embodiment, a data handling system is provided. The data handling system includes a central processing unit and a memory device which are coupled together by a system bus. The memory device includes the memory device discussed above.

Another embodiment of the present invention includes a method of forming plugs between multiple semiconductor surface structures on a substrate. The method includes forming a first opening in a first isolation layer on the semiconductor surface structures. Forming the first opening includes exposing portions of the substrate between the multiple surface structures. A first conductive material is deposited in the first opening to cover the multiple surface structures. A second isolation layer is formed across the first conductive material. A second opening is formed in the first conductive material in a source region on the substrate. Forming the second opening includes exposing portions of an adjacent pair of the multiple surface structures. The method further includes forming spacers on interior walls of the second opening. Forming the spacers includes separating the first conductive material into an inner plug, isolated beneath and between the adjacent pair, and a pair of outer plugs. The outer plugs also cover portions of the adjacent pair. Further, a second conductive material is formed in the second opening and is isolated from the outer plugs by the spacers.

Thus, a method and structure for an improved alignment tolerance between semiconductor layers are provided. The invention discloses a novel method for forming individual contact plugs with an increased surface area for improved registration tolerance to contact openings having a taper.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

Figure 1A:
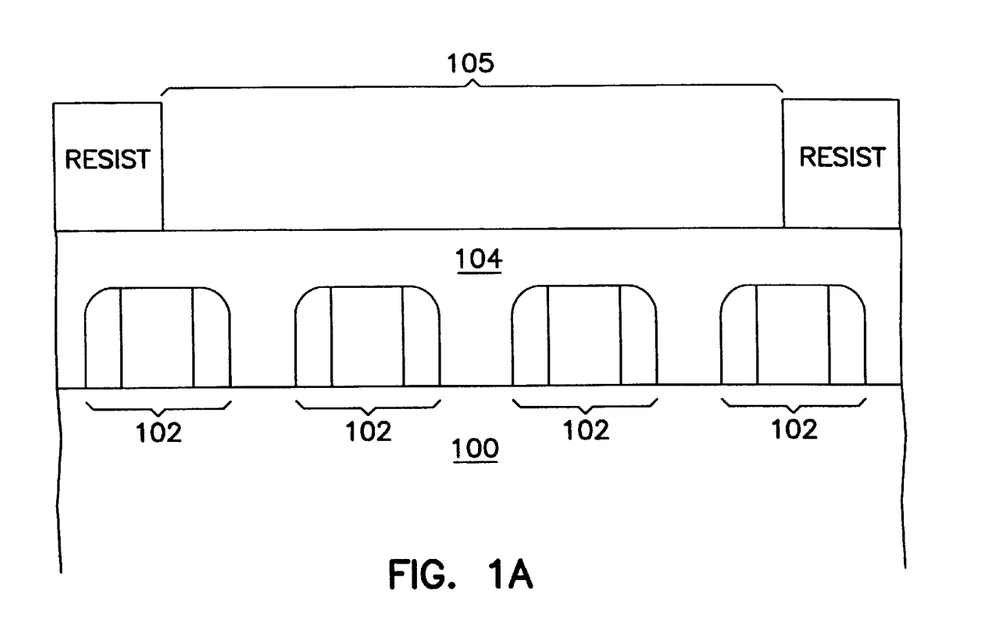
FIGS. 1A–1F are cross-sectional views which illustrate an embodiment of an integrated circuit device including contact plugs and contact openings.

FIGS. 1A–1F are cross-sectional views which illustrate an embodiment for fabricating an integrated circuit device including contact plugs and contact openings. FIG. 1A illustrates the structure at the point where IGFET, or simply transistor, fabrication has been completed up through covering source and drain regions as well as multiple semiconductor surface structures 102 on a substrate 100 with a first isolation layer 104. In one embodiment, the first isolation layer 104 includes an oxide layer 104 which has been applied using chemical vapor deposition (CVD). A photoresist is applied and exposed to pattern where a first opening 105 is to be formed in the first isolation layer 104. The structure is now as appears in FIG. 1A.

Figure 1B:
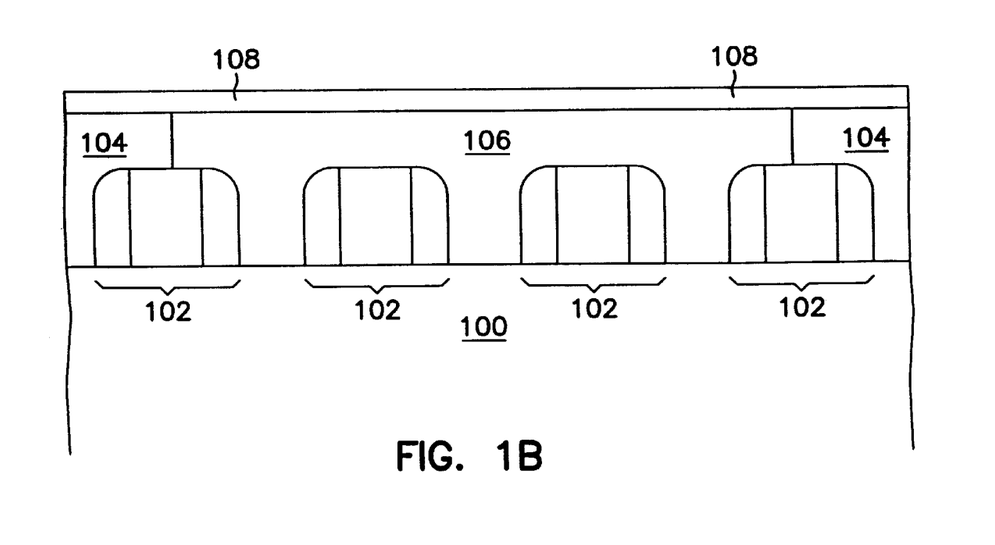

FIG. 1B illustrates the structure following the next sequence of fabrication steps. The first isolation layer 104 is etched using any suitable technique such as, for example, reactive ion etching (RIE). Alternatively, the isolation layer 104 can be removed using a buffered oxide etch (BOE). The photoresist is then removed using conventional photoresist stripping techniques. The etching process forms a first opening 105 in the first isolation layer 104. Forming the first opening 105 includes exposing portions of the multiple semiconductor surface structures 102 and includes exposing portions of the substrate 100 between the exposed multiple semiconductor surface structures 102. Next, a first conductive material 106 is deposited in the first opening 105. In one embodiment, the first conductive material 106 includes polysilicon and is deposited using CVD. The first conductive material 106 in next planarized stopping on the first isolation layer 104 as shown in FIG. 1B. The first conductive material is planarized using any suitable technique such as, for example, chemical mechanical planarization (CMP) or, alternatively, a blanket dry etch process. A second isolation layer 108 is formed over the first conductive material 106. The second isolation layer 108 can include an oxide layer 108 deposited using any suitable oxidation technique, e.g. thermal oxidation or CVD process. In an alternative embodiment, the second isolation layer 108 can include a silicon nitride ($Si_3N_4$) layer 108 formed by CVD. The structure is now as is shown in FIG. 1B.

Figure 1C:
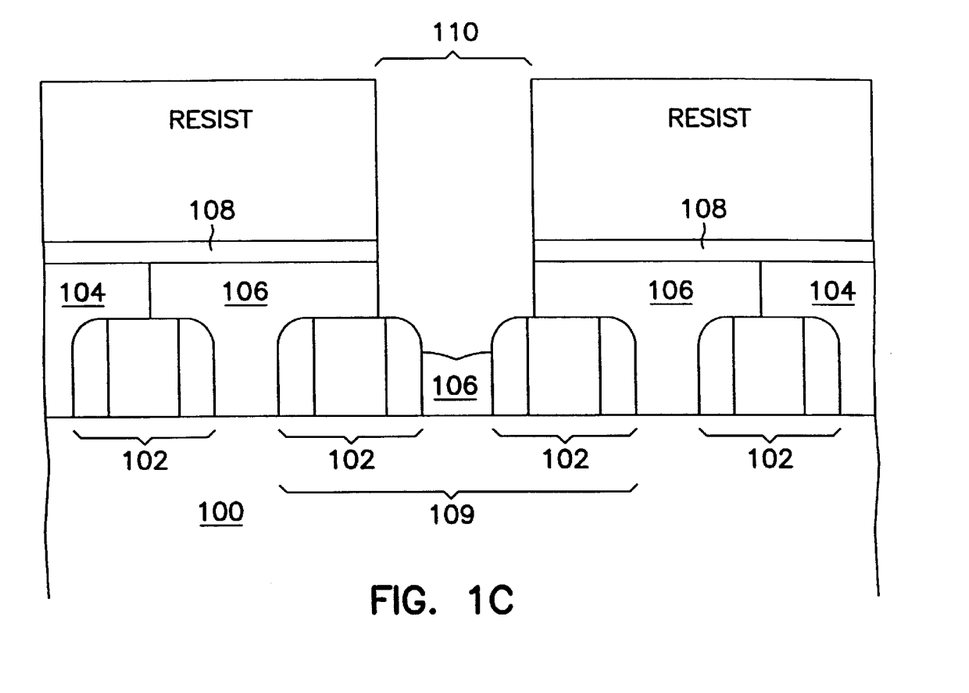

FIG. 1C illustrates the structure following the next series of process steps. A photoresist is applied and selectively exposed to pattern where a second opening 110 is to be formed in the first conductive material 106 over a source region in the substrate. In one embodiment, forming the second opening 110 in the first conductive material will constitute a bitline region 110 for a transistor. The second isolation layer 108 is then removed using any suitable process such as, for example, RIE. The etch process is continued so that the second opening 110 continues into the first conductive material 106. The first conductive material is etched also using an RIE process. Forming the second opening 110 in the first conductive material 106 includes exposing portions of an adjacent pair 109 of the multiple surface structures 102. In one embodiment the first conductive material 106 is etched beneath the top surfaces of the adjacent pair 109. The structure is now as appears in FIG. 1C.

Figure 1D:
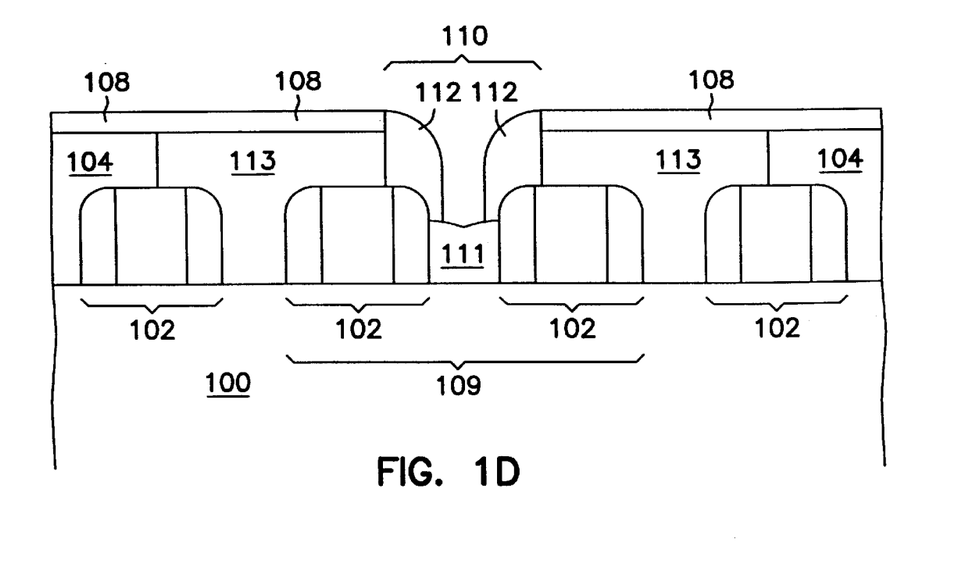

FIG. 1D illustrates the structure after the next group of processing steps. The photoresist is stripped using conventional photoresist stripping techniques. Spacers 112 are then formed on the interior walls of the second opening 110. The spacers 112 are formed by depositing an insulator material, such as silicon dioxide ($SiO_2$) or silicon nitride ($Si_3N_4$), into the second opening 110. The insulator material is deposited using any suitable technique, e.g., CVD. The insulator material is then directionally etched leaving spacers 112 formed only on the interior walls. Forming spacers 112 on the interior walls of the second opening 110 includes separating the first conductive material into an inner plug 111 beneath and between the adjacent pair 109. Forming spacers 112 on the interior walls further includes separating the first conductive material 106 into a pair of outer plugs 113. The outer plugs 113, however, also cover portions of the top surfaces of the adjacent pair 109. In one exemplary embodiment, forming the inner plug 111 constitutes forming a bitline plug 111. Also, in an exemplary embodiment, forming the pair of outer plugs 113 constitutes forming a pair of storage node plugs 113. The structure is now as appears in FIG. 1D.

Figure 1E:
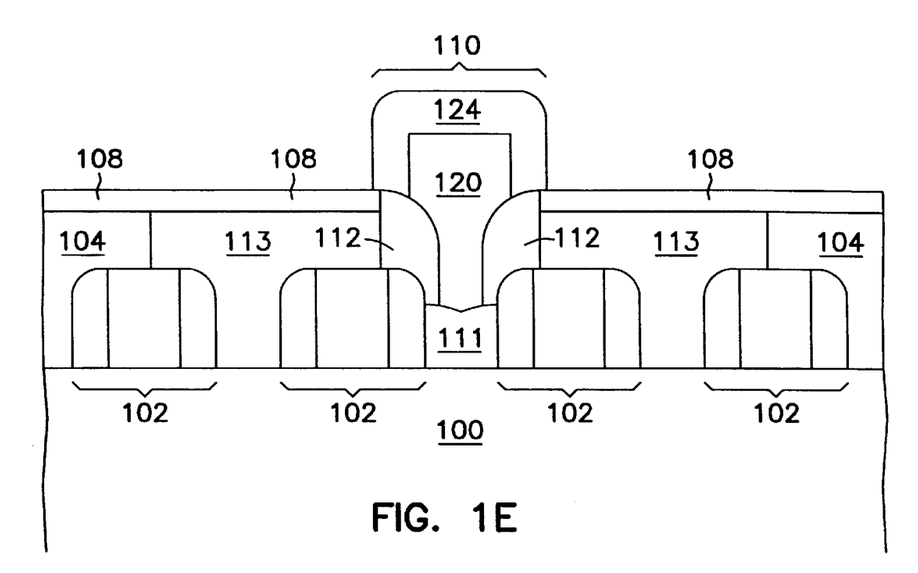

FIG. 1E illustrates the structure after the next sequence of fabrication steps. A second conductive material 120 is formed in the second opening 110. In one exemplary embodiment, forming the second conductive material 120 includes forming a bitline 120. In one embodiment, the second conductive material 120 includes an alloy formed from a refractory metal-polysilicon salicidation process. Such salicidation processes and other metallization techniques are understood by one practicing in the field of semiconductor fabrication and thus are not recited here. In an alternative embodiment, the second conductive material 120 includes polysilicon deposited using a CVD process. Next, a subsequent isolation layer, or bitline isolation layer 124, is formed using conventional techniques to isolate, or bury, the second conductive material 120 as well as to provide a surface upon which further metallization layers and semiconducting layers can be fabricated. The technique for doing the same do not form part of the present inventive structure and thus are not presented herein. Such techniques will be understood, however, upon reading this description by one practicing in the field of semiconductor fabrication. The structure is now as is illustrated in FIG. 1E.

Figure 1F:
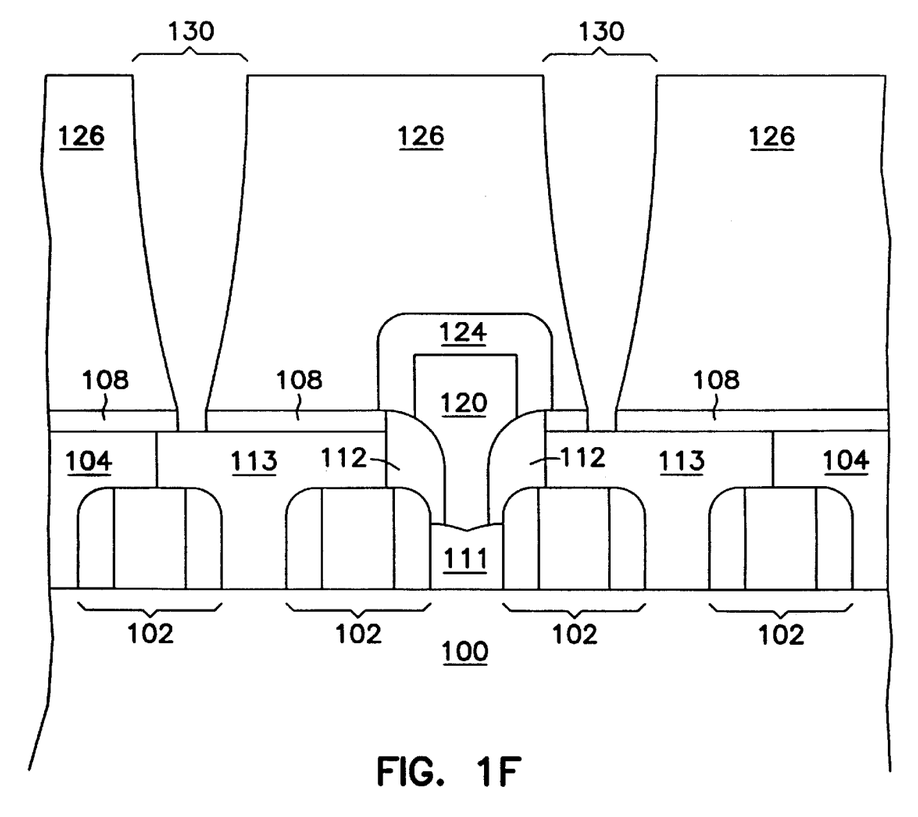

In FIG. 1F, an exemplary embodiment of the structure is illustrated with the third isolation layer 126 formed. Additionally, contact regions 130, or contact openings 130, have been fabricated according to conventional semiconductor fabrication steps. The contact openings 130 provide a clearer illustration of the manner by which the larger surface area of the pair of outer plugs allows for significantly improved alignment tolerances. In example, the method and structure easily facilitate forming electrical contacts or capacitor storage nodes after the forming of a buried bitline in an IGFET.

Figure 2:
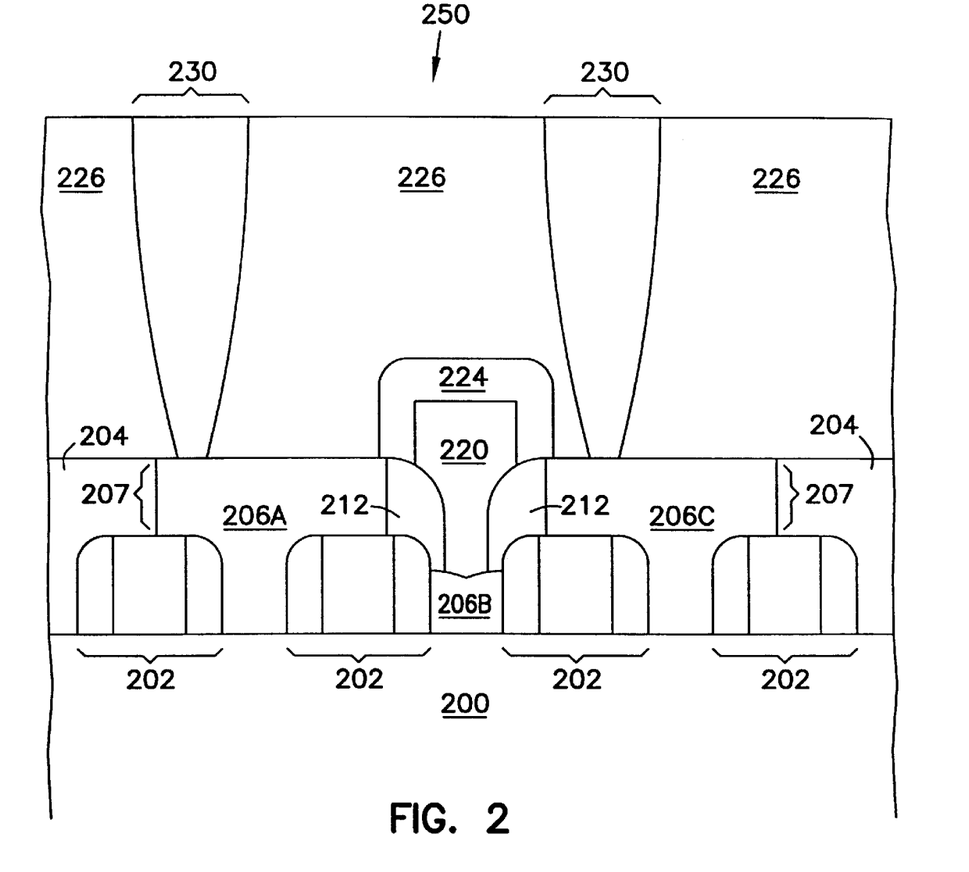
FIG. 2 is cross-sectional view which illustrates an embodiment of an integrated circuit device according to the teachings of the present invention.

FIG. 2 is a cross-sectional view which illustrates an embodiment of an integrated circuit device 250 according to the teachings of the present invention. As shown in FIG. 2 the structure includes a substrate 200 with a number of semiconductor surface structures 202 spaced apart along the substrate 200. In one embodiment, the substrate 200 includes a doped silicon structure. In an alternative embodiment, the substrate 200 includes an insulator layer. In a further exemplary embodiment, the substrate 200 may include a body region of single crystalline silicon (Si) which has been doped with a p-type dopant to form a p-type body region. The substrate 200 would then also consist of a first source/drain region and a second source/drain region in that substrate 200 which have been doped with an n-type dopant to form n-type source/drain regions. Likewise, the doping types in the components just mentioned can be reversed to create alternate conduction methods in the substrate. In one embodiment, the number of semiconductor surface structures include isolated wordlines 202 running along the surface of the substrate. In an alternate embodiment, the number of semiconductor surface structures include isolated flash memory cells 202. A number of plugs 206A, 206B, and 206C, collectively referred to as 206, form electrical contact to the substrate 200 between the number of surface structures 202 and an isolation layer 204. In one embodiment, the number of plugs 206 include polysilicon plugs.

Specifically, the number of plugs include an inner plug 206B and a pair of outer plugs, or outer pair 206A and 206C. In one exemplary embodiment, the inner plug 206B includes a bitline plug and is formed beneath a top surface of the number of semiconductor surface structures 202. Also, in one exemplary embodiment, the pair of outer plugs 206A and 206C include storage node plugs 206A and 206C. Each one of the outer pair, 206A and 206C, is formed adjacent to and on opposing sides of the inner plug 206B. Also, each of the outer pair, 206A and 206C, includes an upper portion 207. The upper portions 207 cover areas of the surface structures 202. Further, an inner electrical contact 220 couples to the inner plug 206B. In one exemplary embodiment, the inner electrical contact 220 includes a buried bitline 220. The inner electrical contact 220 is separated from the upper portions 207 of the outer pair, 206A and 206C, by a pair of opposing spacers 212. In one embodiment, the pair of opposing spacers 212 includes a pair of opposing silicon dioxide ($SiO_2$) spacers 212. In an alternate embodiment, the pair of opposing spacers includes a pair of opposing silicon nitride ($Si_3N_4$) spacers 212.

In one embodiment, the integrated circuit device 250 includes a pair of outer contact regions 230 which can include storage nodes 230, or storage node contacts formed from any suitable material. Likewise, the pair of outer contact regions 230 can include tapered electrical contacts 230 formed from any suitable metallization material. The contact regions 230 each individually couple to the one of the pair of outer plugs 206A and 206C through an isolation layer 226. The integrated circuit device 250 can, in one embodiment, include a dynamic random access memory (DRAM). And, in an alternate embodiment, the integrated circuit device 250 includes a synchronous random access memory (SRAM) or even an electronically erasable programmable read only memory (EEPROM).

Figure 3:
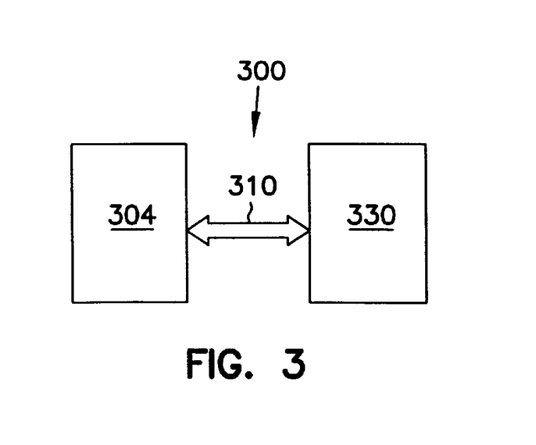
FIG. 3 is a block diagram which illustrates an embodiment of a data handling system according to the teachings of the present invention.

FIG. 3 is a block diagram illustrating an data handling system 300 according to an embodiment of the present invention. FIG. 3 illustrates that data handling system includes a central processing unit (CPU) 304. The CPU 304 is communicatively coupled to a memory device 330 by a system bus 310. The memory device includes the memory device provided and described above in connection with FIG. 2. CPUs 304 and system buses 310 are well known to those of ordinary skill in the art. These CPUs 304 and system buses 310 are commercially available in many suitable forms for implementation with the present invention. Those skilled in the art will recognize and be able to employ such suitable devices with the present invention. As such, a detailed description of these CPUs 304 and system buses 310 is not provided here.

CONCLUSION

An improved method and structure for increasing the alignment tolerances in multiple, singularized plugs are provided. The invention discloses a novel method for forming individual plug contacts with increased surface area for improved registration between semiconducting layers. Also the improved plug contacts are particularly well suited to receiving contact formations which have any taper to them. IGFETS and other devices formed from this design can be used in a variety of beneficial applications, e.g. logic or memory.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating interconnections on a substrate, the method comprising:
    covering multiple surface structures on the substrate with a first isolation layer;
    etching a portion of the first isolation layer to expose portions of the multiple surface structures and portions of the substrate between the multiple surface structures;
    depositing a first conductive material to cover the multiple surface structures and portions of the substrate between the multiple surface structures;
    forming a second isolation layer on the first conductive material;
    etching a portion of the second isolation layer and a portion of the first conductive material above portions of an adjacent pair of the multiple surface structures until the portion of the first conductive material is beneath and in between the adjacent pair, and is isolated from portions of the first conductive material covered part of top surfaces of the adjacent pair;
    forming spacers between the portion of the first conductive material beneath and in between the adjacent pair and the portions of the first conductive material covered part of top surfaces of the adjacent pair;
    forming a second conductive material on the first conductive material beneath and in between the adjacent pair;
    covering second conductive material and the second isolation layer with a third isolation layer; and
    forming a contact opening to one of the portions of the first conductive material covered part of top surfaces of the adjacent pair.

2. The method of claim 1, wherein the method further includes planarizing the first conductive material.

3. The method of claim 1, wherein the method further includes forming another contact opening to another portions of the first conductive material covered part of top surfaces of the adjacent pair.

4. The method of claim 1, wherein forming spacers includes:
    depositing isolation material over the first conductive material beneath and in between the adjacent pair; and
    etching the isolation material to form two separate spacers.

5. A method of fabricating interconnections on a substrate, the method comprising:
    forming a first isolation layer over multiple surface structures on the substrate;
    forming a first opening on the first isolation layer;
    depositing a first conductive material to fill the first opening;
    covering the first conductive material with a second isolation layer;
    forming a second opening on the second isolation layer;
    etching the second isolation layer and the first conductive material in the second opening until one portion of first conductive material is beneath and in between an adjacent pair of multiple surface structures;
    depositing isolator material to fill the second opening;
    etching the isolator material to form opposing spacers on internal walls of the second opening;
    forming a second conductive material in the second opening;
    burying the second conductive material with an isolation material;
    covering second conductive material and the second isolation layer with a third isolation layer; and
    forming contacts opening to portions of the first conductive material which are not beneath and in between the adjacent pair.

6. The method of claim 5, wherein the method further includes planarizing the first conductive material.

7. The method of claim 5, wherein informing a first opening includes etching a portion of the first isolation layer to expose the multiple surface structures and portions of the substrate between the multiple surface structures.

8. The method of claim 5, wherein forming a second opening includes applying a patterned resist over the second isolation layer.

9. The method of claim 5, wherein forming a second opening include exposing portions of the second isolation layer above an adjacent pair of the multiple surface structures.

10. The method of claim 5, wherein etching the isolator material to form opposing spacers includes exposing the first conductive material beneath and in between an adjacent pair.

11. The method of claim 5, wherein etching isolator material to form opposing spacers includes directionally etching the isolator material.

12. A method of fabricating interconnections on a substrate, the method comprising:
    forming a first isolation layer on multiple surface structures on the substrate;
    forming a first opening by etching a portion of the first isolation layer to expose the multiple surface structures and portions of the substrate between the multiple surface structures;
    depositing a first conductive material to fill the first opening;
    covering the first conductive material with a second isolation layer;
    forming a second opening on the second isolation layer by applying a pattern resist over the second isolation layer to expose portion of the second isolation layer above an adjacent pair of the multiple surface structures;
    forming inner plug and a pair of outer plugs separated from the inner plug by etching the second isolation layer and the first conductive material in the second opening, wherein the inner plug is beneath and in between the adjacent pair, and each of the outer plugs covers a part of a top surface of one of the surface structures of the adjacent pair;

depositing isolator material to fill the second opening;

etching the isolator material to form opposing spacers between the inner plug and the outer plugs;

forming a buried bitline in the second opening;

covering the buried bitline and the second isolation layer with a third isolation layer; and forming contacts opening to the pair of outer plugs.

13. The method of claim 12, wherein etching isolator material to form opposing spacers includes exposing the inner plug in the second opening.

14. The method of claim 12, wherein forming a buried bitline in the second opening includes:

depositing a second conductive material in the second opening, wherein the second conductive material contacts the inner plug; and covering the second conductive material with an isolation material.

15. A method of fabricating interconnections on a substrate, the method comprising:

depositing a conductive material over multiple surface structures on the substrate;

etching a portion of the conductive material over a pair of surface structures to form a bitline plug and a pair of storage node plugs, wherein the bitline plug is in between and beneath the pair of surface structures and separated from the storage node plugs, wherein top portion of each of the storage node plugs covers a part of top surface of one surface structure of the pair of surface structures;

forming a pair of opposing spacers between the bitline plug and the pair of storage node plugs;

forming a bitline over the bitline plug, wherein the bitline is separated from the storage node plugs by the pair of opposing spacers;

depositing an isolation layer over the bitline and the storage node plugs; and forming contact regions over the storage node plugs.

16. The method of claim 15, wherein forming a pair of opposing spacer includes:

depositing isolation material over the bitline plug; and etching the isolation material to form two separate spacers.

17. The method of claim 15, wherein forming the bitline includes joining the bitline with the bitline plug.

18. The method of claim 15 further includes burying the bitline with an isolator material.

* * * * *

UNITED STATES PATENT AND TRADEMARK OFFICE
CERTIFICATE OF CORRECTION

PATENT NO. : 6,225,208 B1
DATED : May 1, 2001
INVENTOR(S) : Figura

It is certified that error appears in the above-identified patent and that said Letters Patent is hereby corrected as shown below:

Title page,
 In the title delete "SINGULARIZED" and insert -- SINGULATED --.

Column 1,
Line 3, delete "SINGULARIZED" and insert -- SINGULATED --.

Column 6,
Line 45, delete "an data" and insert -- a data --.

Signed and Sealed this

Twenty-seventh Day of November, 2001

Attest:

*Attesting Officer*

NICHOLAS P. GODICI
*Acting Director of the United States Patent and Trademark Office*